United States Patent [19]

Beppu et al.

[11] 3,951,700

[45] Apr. 20, 1976

[54] METHOD OF MANUFACTURING A GALLIUM PHOSPHIDE LIGHT-EMITTING DEVICE

[75] Inventors: Tatsuro Beppu, Tokyo; Masami Iwamoto, Yokohama; Tetsuo Sekiwa, Kawasaki, all of Japan

[73] Assignee: Tokyo Shibaura Electric Co., Ltd., Japan

[22] Filed: Aug. 16, 1974

[21] Appl. No.: 498,213

[30] Foreign Application Priority Data

Oct. 26, 1973 Japan.............................. 48-119991
Nov. 21, 1973 Japan.............................. 48-130103
Nov. 22, 1973 Japan.............................. 48-130710

[52] U.S. Cl................................. 148/171; 148/172; 148/173; 148/1.5; 252/62.3 GA; 156/624
[51] Int. Cl.².......................................... H01L 7/38
[58] Field of Search......................148/171–173, 1.5; 252/62.3 GA; 156/624

[56] References Cited

UNITED STATES PATENTS

| 3,462,320 | 8/1969 | Lynch et al.......................... 148/171 |
| 3,603,833 | 9/1971 | Logan et al...................... 148/171 X |
| 3,715,245 | 2/1973 | Barnett et al........................ 148/171 |
| 3,759,759 | 9/1973 | Solomon.............................. 148/171 |
| 3,854,447 | 12/1974 | Kobayashi....................... 148/171 X |

*Primary Examiner*—G. Ozaki
*Attorney, Agent, or Firm*—Cushman, Darby & Cushman

[57] ABSTRACT

A method of manufacturing a gallium phosphide light-emitting device which characteristically comprises the step of growing a gallium phosphide layer of one conductivity type on a gallium phosphide substrate of the opposite conductivity type at a growth initiating temperature of 650° to 850°C by the liquid phase epitaxy process to provide a p-n junction contributing to emission of light.

3 Claims, 6 Drawing Figures

METHOD OF MANUFACTURING A GALLIUM PHOSPHIDE LIGHT-EMITTING DEVICE

This invention relates to a method of manufacturing a gallium phosphide light-emitting device.

It is known that a light-emitting device formed of gallium phosphide (hereinafter abbreviated as "GaP") has a light-emitting p-n junction contributing to emission of light, and that where a region several microns thick including the light-emitting p-n junction is doped with a proper amount of zinc (Zn) and oxygen (O), then said junction gives forth a red light, and where said region is doped with a proper amount of nitrogen (N), then said junction emits a green light.

There will now be described the prior method of manufacturing a GaP light-emitting device. An n-type solution for liquid phase epitaxial growth (hereinafter abbreviated as "LPE solution") maintained at a temperature of 1000° to 1100°C is brought into contact with the surface of, for example, an n-type liquid-encapsulated Czochralski (abbreviated as "LEC") crystal. Thereafter the solution is cooled at a prescribed cooling rate to form an n-type liquid phase epitaxial layer (hereinafter abbreviated as "LPE layer"). Next, a p-type LPE solution maintained at 1000° to 1100°C is brought into contact with the surface of the aforesaid n-type LPE layer. Said p-type LPE solution is cooled at a prescribed cooling rate to form a p-type LPE layer on the n-type LPE layer, thereby providing a p-n junction. With a GaP green light-emitting device, nitrogen atoms constituting luminescent center each producing a green light are positioned near the n side of the p-n junction. The nitrogen atoms are doped in the n-type LPE layer during its growth.

Application of such high temperature as 1000° to 1100°C in the prior method for initiation of the growth of the p-type LPE layer has been supposedly for the reasons: first, that a low growth-initiating temperature fails to provide a sufficiently thick p-type LPE layer; secondly, that said low growth-initiating temperature results in the reduced crystalline perfection of said p-type LPE layer; and thirdly, that contamination by a red light becomes prominent to obstruct the emission of the desired green light.

It is accordingly an object of this invention to provide a method of manufacturing a GaP light-emitting device of high luminescent efficiency.

Another object of the invention is to provide a GaP green light-emitting device of high luminescent efficiency and slightly contaminated by a red light.

The first object of the invention is attained by the process of growing a liquid phase epitaxial GaP layer of one conductivity type on a GaP substrate of the opposite conductivity type with said epitaxial growth started at a temperature of 650° to 850°C to provide a p-n junction contributing to emission of light.

The second object of the invention is attained by the process of bringing a p-type epitaxial solution of GaP maintained at a temperature of 650° to 850°C into contact with an n-type GaP substrate, and cooling the solution of said temperature at the cooling rate of 0.1° to 4°C/min. to form a p-type liquid-phase epitaxial layer on said substrate, thereby providing a p-n junction contributing to emission of light.

This invention can be more fully understood from the following detailed description when taken in conjunction with the accompanying drawings, in which.

Figure 4:
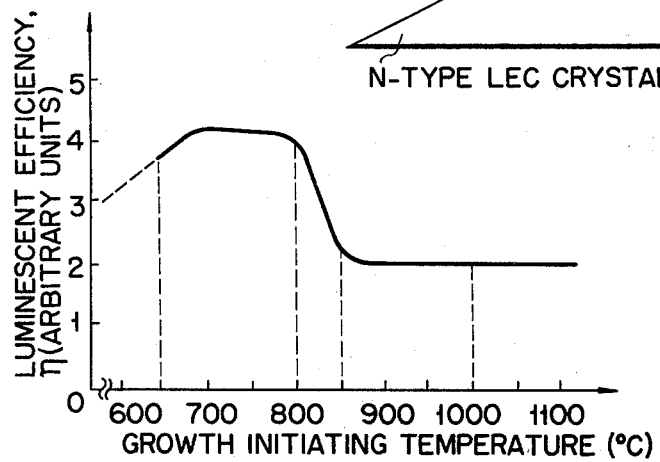
Figure 5:
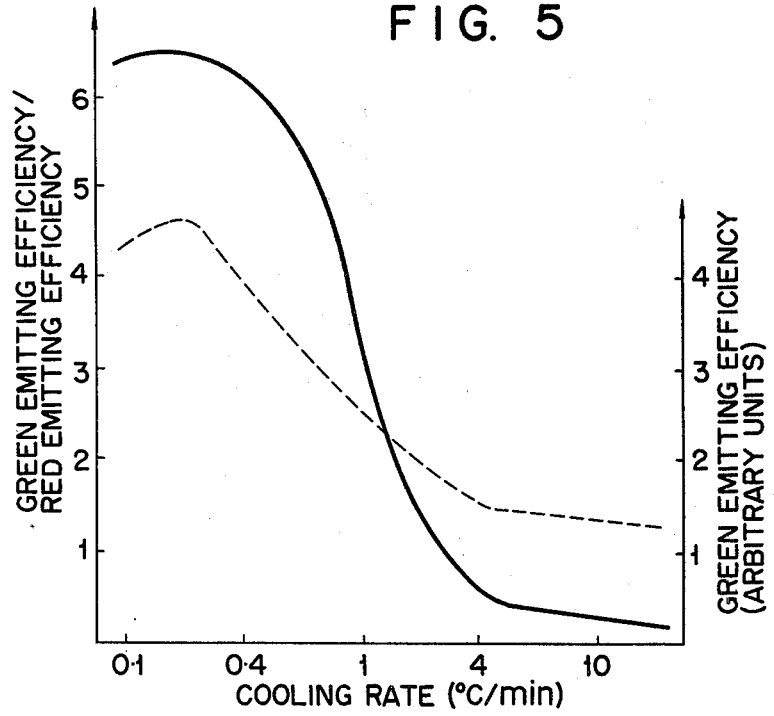
Figure 3:
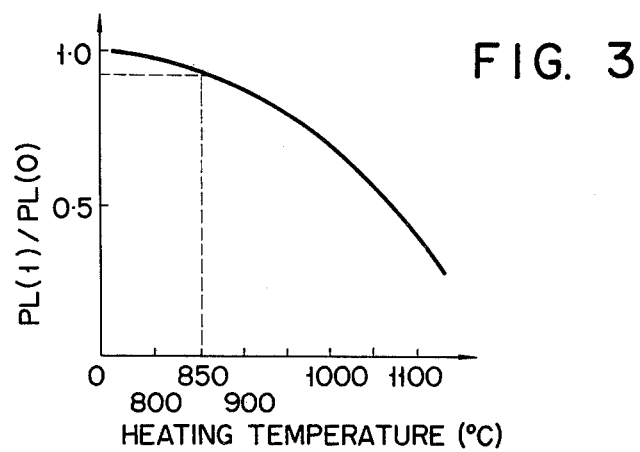
Figure 6:
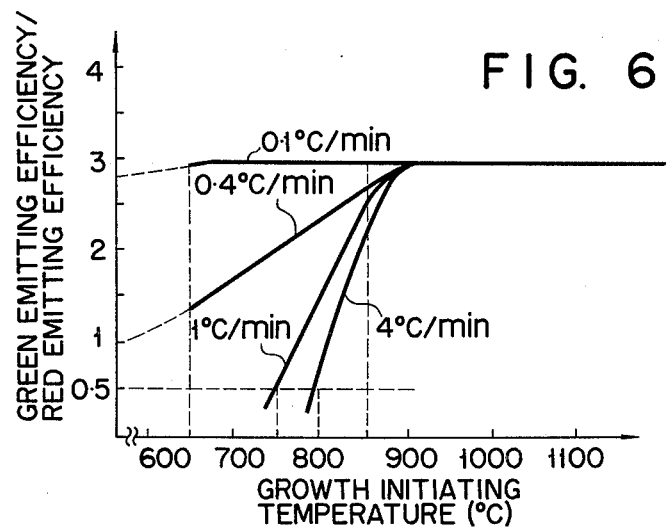

FIG. 3 indicates the effect of heat treatment on the PL intensity;

FIG. 4 presents a relationship between a light-emitting efficiency and a temperature at which the epitaxial growth is commenced; and FIGS. 5 and 6 both set forth the effect of the cooling rate.

Figure 1:
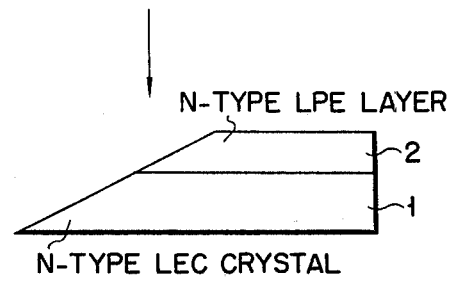
FIG. 1 is a chart illustrating the method of measuring the intensity of photoluminescence (hereinafter abbreviated as "PL")
Figure 2:
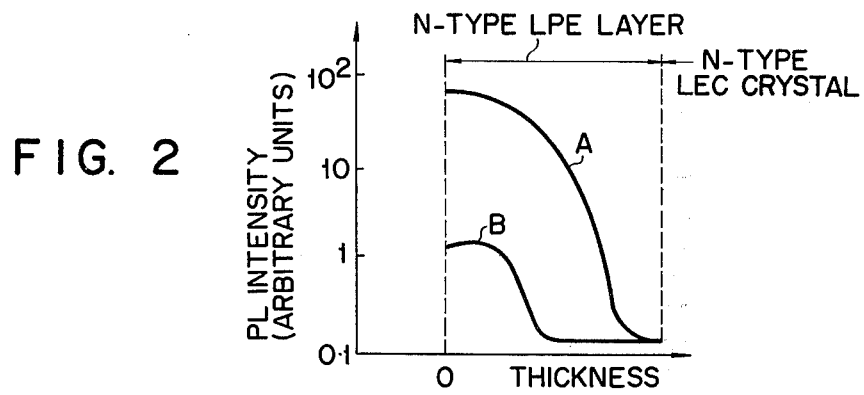
FIG. 2 shows the distribution of the PL intensity in the n-LPE crystal.

A plurality of samples of a double-layer GaP wafer substrate were prepared by growing, as shown in FIG. 1, an n-type GaP LPE layer 2 whose donor consisted of tellurium (Te) on the (111) phosphorus face of an n-type liquid encapsulated Czochralski (LEC) crystal with said growth started at a temperature of 1000°C. At this time, the n-type LPE GaP layer 2 was doped with nitrogen atoms, using a gaseous atmosphere of hydrogen containing a minute amount of ammonia. One of the samples thus prepared was vertically cut into two pieces. One cut piece was placed in a reactor to be heated 10 minutes at a temperature of 1000°C in an atmosphere of hydrogen, while the other cut piece was not subjected to said heat treatment. These two cut pieces of a double-layer GaP wafer sample were ground at an angle shown in FIG. 1. A laser beam of argon ions having a wave length of 4880 A was irradiated on the ground surface in the direction of the indicated arrow to measure the PL intensity from the excitation of the ground surface by the laser beam of argon ion, the results being set forth in FIG. 2. Various degrees of the depth of the double-layer GaP wafer were plotted on the abscissa of FIG. 2, and the PL intensities corresponding to said depths were plotted on the ordinate. The curve A corresponds to the cut piece of the wafer which was not heated and the curve B to the cut piece of the wafer which was heated. FIG. 2 shows that the PL intensity on the surface of the n-type GaP LPE layer 2 of the heated cut piece was reduced to unity as compared to the PL intensity approaching $10^2$ arbitrary units of the nonheated cut piece. It was also disclosed that said decreased PL intensity occurred not only on the surface of the n-type LPE layer but also in the interior thereof. FIG. 3 presents data on the measurement of the PL intensity with the heating temperature varied and treating time fixed at 10 minutes, and also indicates the ratio of the PL intensity PL(O) on the surface of the n-type LPE layer before heat treatment to the PL intensity PL(1) on said surface after heat treatment. It was experimentally found, as shown in FIG. 3, that when heat treatment was carried out at a lower temperature than, for example, 850°C, a decline in the PL intensity accounted for 10% of that indicated before heat treatment. This invention has been realized from the above-mentioned experiments. Though it was formerly supposed that the low temperature growth of a GaP layer disturbed the crystalline perfection of the GaP layer and failed to attain its completely rapid growth, the present inventors' experiments are to the contrary and have disclosed that application of high temperature as in the prior art actually reduced the PL intensity. Even when the inventors ventured to grow a p-type GaP LPE layer on an n-type GaP LPE substrate at a lower temperature than 850°C to make a GaP light-emitting diode, the product displayed a higher light-emitting efficiency than has been possible with the prior art procedures, the details of this experiment being set forth in the following Example 1.

EXAMPLE 1

An n-type LPE layer containing nitrogen whose donor consisted of tellurium was grown by the ordinary liquid phase epitaxy on the (111) phosphorus face of an n-type GaP LEC crystal with said growth commenced at a temperature of 1000°C to provide a double-layer wafer substrate of n/n structure. In this case, a carrier concentration near the surface of the n-type LPE layer was set at $3 \times 10^{17} cm^{-3}$ and a nitrogen concentration at $5 \times 10^{18} cm^{-3}$. The process up to formation of the n-type LPE layer may be effected in the same manner as in the prior art. A p-type LPE layer was formed on said n-type LPE layer by cooling a p-type epitaxial solution of a temperature set at a lower level than 850°C at the cooling rate of, for example, 0.5°C/min. When measurement was made of the light emitting efficiency ($\eta$) of a triple layer diode of p-n-n structure, it was found that where the liquid phase growth of said p-type epitaxial layer was commenced at a lower temperature than 850°C, the product diode displayed a higher light-emitting efficiency than in the prior art as shown in FIG. 4. Particularly where the p-type epitaxial growth was commenced at a temperature ranging from about 700°C to about 800°C, followed by cooling at a prescribed rate, then the product obtained indicated a higher light-emitting efficiency than twice that realized by the prior art. In this example, a carrier concentration near the p-n junction of the p-type LPE layer was chosen to be $1 \times 10^{18} cm^{-3}$. The example further proved that application of an even lower temperature than 650°C in starting the epitaxial growth provided a more luminescent product than in the prior art, though it was somewhat difficult to control a crystalline growth.

The reason why this invention can provide a GaP light-emitting device of the aforesaid high luminescence is believed to be that since the formation of the p-n junction contributing to emission of light is effected by commencing the epitaxial growth of a p-type LPE layer on an n-type double-layer wafer at a temperature lower than 850°C, the crystalline perfection of a substrate crystal is only slightly affected by such a low temperature, as proved by the experiments described with reference to FIGS. 1 to 3.

In the case of GaP, it has also become clear that non-radiative recombination centers defining the life of the minority-carrier tends to be easily produced. With respect to a GaP green light-emitting diode, it has been confirmed that the formation of non-radiative recombination center has a close relationship with the light-emitting efficiency of said diode. This invention which can be effectively applied to an indirect transition type element such as a red light emitting diode and has failed to display any noticeable effect with respect to a direct transition type crystal such as gallium arsenide (GaAs).

When observation was made of the photoluminescence of an n-type LPE crystal of this invention including nitrogen atoms acting as green light-emitting center, it was found that heat treatment at a higher temperature than 850°C prominently increased non-radiative recombination centers. The concentration of non-radiative recombination centers determining the life of minority-carrier has an inverse proportion to the emission of a green light. Accordingly, the property of displaying green photoluminescence is most adapted to detect changes in the concentration of non-radiative recombination centers. It is considered from the above-mentioned facts that heat treatment at a higher temperature than 850°C gives rise to the formation of non-radiative recombination center shortening the life of minority-carrier even in a crystal free from green light emitting centers. Accordingly, this invention proves most effective, where, in the case of forming a p-n junction, a crystalline layer provided on that side of a GaP green light-emitting device which is subjected to heat treatment contains luminescent centers primarily to act as a luminescent region. Also where a crystalline layer formed on that side of a GaP green light-emitting device which is subjected to heat treatment does not contain luminescent centers and in consequence does not act as a luminescent region, this invention is effective to elevate the light-emitting property of a GaP diode.

The foregoing description relates to the case where a triple layer GaP green light-emitting diode of p-n-n structure was prepared by applying the liquid phase epitaxial process twice. However, where a p-type LPE layer was formed at a lower temperature than 850°C on a substrate of an n-type solution-grown (SG) crystal (which was doped with nitrogen and whose donor concentration was set at $2 \times 10^{17} cm^{-3}$) by applying the liquid phase epitaxial process only once to provide a double-layer green light emitting diode, the product displayed high luminescence.

According to the foregoing Example 1, a p-type GaP layer was formed by liquid phase epitaxy on an n-type nitrogen-doped GaP substrate. However, it has been found that where an n-type nitrogen-doped LPE layer is formed at a lower temperature than 850°C on a p-type GaP substrate prepared from the SG crystal, the product also can give forth a green light very efficiently.

Further, Example 1 refers to the case where a GaP green light-emitting diode was prepared. However, this invention has also proved effective in manufacturing a GaP red light-emitting diode. In the latter case, the formation of an n-type LPE layer on a p-type GaP substrate at a lower temperature than 850°C displayed a prominent effect.

The foregoing description refers to the case where a GaP light-emitting device was manufactured with a single p-n junction. However, this invention is not limited to this embodiment, but is also applicable to the case where a p-n junction is formed on a substrate on which another p-n junction is already grown. Namely, the invention has proved prominently effective in the case where a negative resistance light-emitting element of p-n-p-n structure is manufactured by growing a p-type LPE layer on a triple layer wafer substrate of n-p-n structure to provide a light-emitting p-n junction. The invention is further effective in the case where liquid phase epitaxial growth is carried out twice on the n-type layer of a red light-emitting diode substrate of n-p structure to provide a p-n junction for a green light, thereby producing a GaP light-emitting device bearing two p-n junctions respectively giving forth red and green lights.

As mentioned above, this invention can manufacture a high luminescence GaP device capable of displaying a green or red light. The present inventors' further studies have disclosed that where a GaP green light-emitting device is manufactured by bringing a p-type LPE solution into contact with an n-type GaP substrate and later cooling said solution to form a p-type LPE layer, oxygen tends to be carried into said p-type LPE layer, unless said cooling is effected at a prescribed rate, thereby causing an appreciable amount of red light to be mixed with a green light. It has also been discovered that where a red light (whose spectrum indicates a peak wave length in a region of about 7000 A, and a half value width of 1000 A) is mixed with a green light (whose spectrum presents a peak wave length in a region of 5650 A to 5670 A and a half value width of about 250 A) with a higher luminescence than twice that of the green light, then the green light of a GaP diode turns yellow or yellowish orange. Human beings generally have a 30-fold eyesight for a GaP green light as compared with that for a GaP red light. Supposing, therefore, that the green and red lights have the same quantum efficiency, the green light has a 30-fold brightness to the human eye as compared with the red light.

The green light of a GaP green light-emitting diode and the contaminating red light unavoidably emitted therefrom were separately measured by a combination of a corrected solar cell value, a spectrophotometric value and a value measured by an integrating sphere.

A high luminescence GaP green light-emitting device only slightly contaminated by inclusion of a red light is manufactured by a process detailed in the following Example 2.

EXAMPLE 2

An n-type LPE layer whose donor consisted of tellurium (Te) was grown in liquid phase on the (111) phosphorus face of an n-type GaP-LEC crystal with said growth commenced at temperature of 1000°C. At this time, the n-type LPE layer was doped with about $3 \times 10^{18} cm^{-3}$ of nitrogen atoms acting as luminescent center, using, for example, ammonia gas or gallium nitride (GaN). A p-type LPE layer was grown on the n-type LPE layer with said growth commenced at 800°C, followed by cooling effected at the rate indicated in FIG. 5. Later, a light-emitting diode was prepared by the customary process. Measurement was made of the luminescence of a green light generated by the diode, as well as of the ratio which the green light bears to the contaminating red light unavoidably emitted from the diode. It was found that where cooling was carried out at a slower rate than 4°C/min, as shown in FIG. 5, a green light (indicated in a broken line) became prominent with a resultant decline in the emission of a red light and in consequence the ratio of the green light to the red light (shown in a solid line), namely, a green light slightly contaminated by a red light increased. A slower cooling rate than 0.1°C/min. caused a p-type LPE layer to be grown in a longer time and presented difficulties in controlling the temperature of a reactor, and consequently providing a high quality light-emitting element.

Next, substantially the same process of Example 2 was repeated by starting the formation of the p-type LPE layer at a temperature of 650° to 850°C and varying the rate of cooling said layer within a range of 0.1° to 4°C/min. Measurement was made of the ratio of the green luminescence to the contaminating red luminescence of a plurality of samples of green light-emitting diodes obtained, the results being set forth in FIG. 6. FIG. 6 shows the cases where the growth of a p-type LPE layer was commenced at a higher temperature than 850°C. Where said growth was started at a higher temperature than 900°C, a green light-emitting device was indeed obtained as seen from FIG. 6, regardless of the cooling rate. But a green light-emitting device prepared by starting the growth of a p-type LPE layer at such a high temperature displayed too low a luminescence for practical application.

In contrast, where the formation of the p-type LPE layer was commenced particularly at a lower temperature than 850°C as in this invention, a green light-emitting device was obtained, in which the ratio of the green light to the red light was larger than a prescribed value of 0.5, provided the p-type epitaxial solution was cooled at a slower rate than 4°C/min. The fact that the cooling rate exerts a strong effect on the extent of contamination by an objectionable red light where the growth of an LPE layer is commenced at a lower temperature than 850°C is believed to occur for the following reasons. Namely, where the growth of an LPE layer is started at a high temperature, the intrusion of oxygen into the LPE layer is hardly noticeable independently of the rate of cooling said layer. Contrary, where said growth is commenced at a low temperature, oxygen is ready to be carried into the LPE layer, provided cooling is effected at a quick rate. This leads to the shortened life of minority-carrier near the p-n junction, the weak emission of a green light and the prominent contamination by a red light. On the other hand, where the LPE layer is initially grown at a low temperature and cooled at a slow rate, then oxygen is less likely to be carried into the LPE layer, thereby extending the life of the minority-carrier, intensifying a green light and preventing red light-emitting center from being unduly increased.

In the foregoing examples, a substrate consisting of a wafer prepared by depositing a GaP LPE layer on an LEC crystal. However, this invention is also applicable to the case where the substrate is formed of a liquid-encapsulated Czochralski (LEC) crystal or solution-grown (SG) crystal or another type of crystal in which a diffusion layer or ion-impregnated layer is provided.

What we claim is:

1. In a method of manufacturing a gallium phosphide light-emitting device which comprises the step of growing a gallium phosphide layer of one conductivity type by the liquid phase epitaxial process on a gallium phosphide substrate of the opposite conductivity type to provide a p-n junction contributing to emission of light, the improvement wherein the growth of said gallium phosphide layer is initiated by contacting the gallium phosphide in the molten state at a crystal growth initiating temperature ranging from 650° to 850° C with said gallium phosphide substrate.

2. A method according to claim 1, wherein the growth of said gallium phosphide layer is commenced at a temperature ranging between 700° and 800°C.

3. In a method of manufacturing a gallium phosphide green light-emitting device which comprises bringing a p-type epitaxial solution of gallium phosphide into contact with an n-type substrate of gallium phosphide, cooling said solution for growth of a p-type liquid-phase epitaxial layer on said substrate, thereby providing a p-n junction contributing to emission of light, the improvement wherein the growth of said p-type layer is initiated by contacting the gallium phosphide in the molten state at a temperature ranging from 650° to 850° and at least the light-emitting region of the p-type layer if formed by cooling the p-type solution maintained at said temperature at a cooling rate of from 0.1° C/min. to 4° C/min.

* * * * *